United States Patent [19]
Kan

[11] Patent Number: 4,791,375
[45] Date of Patent: Dec. 13, 1988

[54] APPARATUS FOR DETECTING DEGRADATION OF AN ARRESTER

[75] Inventor: Masahiro Kan, Yokohama, Japan

[73] Assignee: Kabushiki Kaisha Toshiba, Kawasaki, Japan

[21] Appl. No.: 900,417

[22] Filed: Aug. 26, 1986

[30] Foreign Application Priority Data

Sep. 5, 1985 [JP] Japan .................................. 60-196501

[51] Int. Cl.⁴ ............................................ G01K 31/12
[52] U.S. Cl. .................... 324/552; 324/522; 340/647
[58] Field of Search ............... 324/551, 552, 72, 522, 324/424; 361/126, 127, 128, 130, 117; 340/647

[56] References Cited

U.S. PATENT DOCUMENTS

| | | | |
|---|---|---|---|
| 4,142,142 | 2/1979 | Arce | 324/551 |
| 4,259,666 | 3/1981 | Takahashi et al. | 324/551 X |

FOREIGN PATENT DOCUMENTS

55-32439  3/1980  Japan .
60-7356  2/1985  Japan .

OTHER PUBLICATIONS

The Central Institute of Electric Power Industry Research Report No. 183028, T. Yokokura et al, Jan. 1984.

Primary Examiner—Reinhard J. Eisenzopf
Assistant Examiner—Robert W. Mueller
Attorney, Agent, or Firm—Oblon, Fisher, Spivak, McClelland, & Maier

[57] ABSTRACT

An apparatus for detecting degradation of a grounded arrester, including a wave conversion circuit for producing an output signal corresponding to the total leakage current flowing through the arrester, and a phase shifter circuit coupled to the output signal for providing a capacitive-component leakage current signal, which is cancelled from the total leakage current signal by means of a differential amplifier to produce a resistive-component leakage current signal. According to one embodiment, this latter signal is applied to a synchronous rectifier circuit for synchronous rectification of the output signal from the differential amplifier circuit. A real resistive-component leakage current signal is then detected by adjusting the phase shift amount in the phase shifter circuit so that the output signal from the synchronous rectifier circuit may become zero, thereby bringing the phase of the cancelling wave signal in agreement with the phase of the capacitive-component leakage current signal. In another embodiment, the resistive-component current leakage signal is applied to a multiplier and a time averaging circuit, the output of which is likewise nulled by means of the adjustable phase shifter.

4 Claims, 3 Drawing Sheets

APPARATUS FOR DETECTING DEGRADATION OF AN ARRESTER

BACKGROUND OF THE INVENTION

Field of the Invention

This invention relates to an apparatus for detecting degradation of an arrester, for example, of zinc oxide type, and more particularly to an apparatus for easily and precisely detecting degradation of an arrester connected to a high tension a.c. power transmission line.

Discussion of Background

Arresters employing resistors having an excellent non-linear characteristic, e.g., zinc oxide type arresters employing zinc oxide elements, have so far been widely used for protecting various items of electric equipment used in electric power systems from lightning discharges or the like. For the arresters of this type, detecting degradation by measuring the leakage current passing through its resistive component is in general an important question in the maintenance of the arresters.

An apparatus to measure such resistive-component leakage current of the arrester is disclosed for example, in Japanese Patent Publication No. 60-7356/1985. However, since this apparatus can only measure the fundamental frequency portion of the resistive-component leakage current of the arrester, there is a problem of accuracy in its measurement.

Another degradation detecting apparatus is described in Japanese Patent Laid-Open No. 55-32439/1980, which is shown in FIG. 6 of the present disclosure. This apparatus extracts the total leakage current flowing through an arrester 2 connected between a power transmission line 1 and ground using a detector 3 constituted of a resistor, current transformer, or the like, and the same is converted into a signal Io corresponding thereto. This signal Io is applied to a degradation detecting apparatus 4. Meanwhile, the zinc oxide element constituting the arrester 2 can be described by means of the equivalent circuit shown in FIG. 7, in which the total leakage current Io of the arrester is given by a vector sum of a capacitive component (Ic) which does not vary with degradation of the arrester and the resistive component (Ir) which varies with the degradation. Since normally Ic>Ir, "peak value of Io=peak value of Ic" holds as shown in FIG. 8. Making use of this fact, the degradation detecting apparatus 4 automatically derives a signal for the capacitive-component leakage current Ic from the above mentioned signal for the entire leakage current Io, by means of a Schmitt circuit 5 converting an input into a rectangular wave, a low-pass filter 6 converting an input into a sine wave, a phase shifter circuit 7 compensating for a phase delay in an input, a peak value detector circuit 8 detecting the peak value of an input, and an automatic gain control (AGC) circuit 9, and further, the signal for the capacitive-component leakage current Ic is added, as a cancelling wave signal, to the above mentioned signal for the total leakage current Io by means of a differential amplifier 10, and thereby a signal for the resistive-component leakage current Ir is provided.

The above described arrester degradation detecting apparatus has an advantage over the previously mentioned apparatus described in Japanese Patent Publication No. 60-7356 in that the waveform of the resistive-component leakage current can be faithfully reproduced, and is not limited to the basic frequency component, but there is a problem in its phase shifter circuit 7.

That is, while the phase shifter circuit 7 is used for compensating for the delay of the phase of the signal for the total leakage current Io from the phase of the signal for the capacitive-component current Ic, the mentioned phase difference is, in fact, varied by the level of the signal for the resistive-component leakage current Ir, and from this fact is produced a measurement error making precise measurement impossible. If it is desired to solve such a problem, a potential transformer PT or the like may be used to extract a voltage signal, for example, as described in Japanese Patent Publication No. 57-10651/1982, but if this approach is followed, the apparatus becomes larger in size and also becomes complex, and further, measurement itself becomes impossible in the case where the voltage signal cannot be extracted.

Besides, in the measurement with the apparatus of FIG. 6, if the phase adjustment should be made each time to improve accuracy of the measurement, it would become necessary to observe waveforms using an oscilloscope or the like, and this would be unfit for the initial purpose to make simple measurement in the field possible.

SUMMARY OF THE INVENTION

Accordingly, the objects of this invention are to solve the above mentioned problems and to provide a new and improved degradation detecting apparatus of an arrester capable of easily and precisely detecting the degradation of the arrester in the field, e.g., with the arrester as connected to a high tension a.c. power transmission line, and without the need for taking a voltage signal from a potential transformer or the like.

These and other objects are achieved according to the invention by providing a new and improved apparatus for detecting degradation of an arrester, including a wave conversion circuit for producing an output signal corresponding to the total leakage current flowing through the arrester grounded by a grounding conductor, a phase shifter circuit through which the output signal of the wave conversion is passed to provide a capacitive-component leakage current signal, and a differential amplifier for adding this capacitive-component leakage current signal as a cancelling wave signal to the total leakage current signal thereby extracting a resistive-component leakage current signal.

According to a first embodiment of the invention, the apparatus further includes a synchronous rectifier circuit for synchronous rectification of the output signal from the differential amplifier according to the cancelling wave signal and is adapted to detect a real resistive-component leakage current signal by adjusting the phase shift amount in the phase shifter circuit so that the output signal from the synchronous rectifier circuit may become zero and thereby bring the phase of the cancelling wave signal in agreement with the phase of the capacitive-component leakage current signal.

On the other hand in a second embodiment of the invention, there is provided a multiplier for multiplying the output signal from the differential amplifier by the cancelling wave signal, and a time-averaging circuit for averaging the output signal from the multiplier over time, wherein a real resistive-component leakage current signal is detected by adjusting the phase shift amount in the phase shifter circuit so that the output signal from the time-averaging circuit becomes zero, thereby bringing the phase of the cancelling wave signal in agreement with the phase of the capacitive-component leakage current signal.

BRIEF DESCRIPTION OF THE DRAWINGS

A more complete appreciation of the invention and many of the attendant advantages thereof will be readily obtained as the same becomes better understood by reference to the following detailed desription when considered in connection with the accompanying drawings, wherein.

DESCRIPTION OF THE PREFERRED EMBODIMENTS

Figure 1:
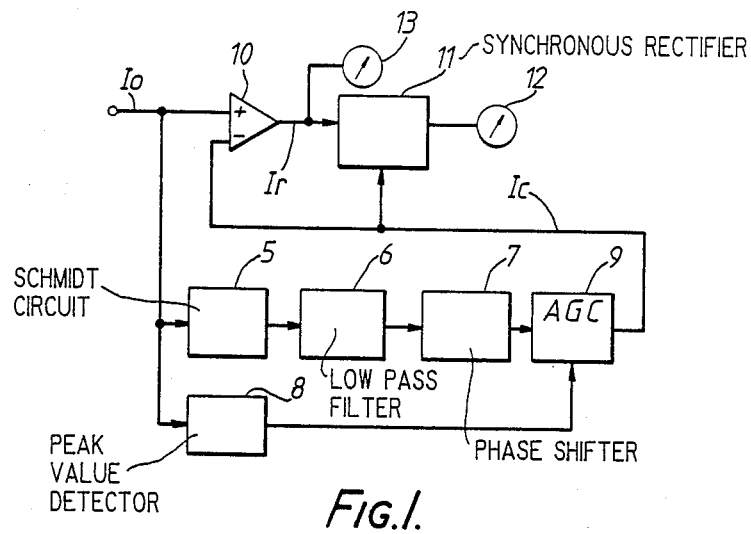
FIG. 1 is a block diagram showing a first embodiment of the invention.

Referring now to the drawings, wherein like reference numerals designate identical or corresponding parts throughout the several views, and more particularly to FIG. 1 thereof, there is shown in a block diagram an example of the structure of the apparatus for detecting degradation of arresters according to the first embodiment of the invention. In FIG. 1, numeral 11 denotes a synchronous rectifier circuit for making synchronous rectification of the output signal Ir from the differential amplifier 10 according to the cancelling wave signal Ic as the output signal from the automatic gain control circuit 9, numeral 12 denotes a meter for indicating the magnitude of the output signal from the synchronous rectifier circuit 11, and numeral 13 denotes a meter for indicating the magnitude of the output signal Ir from the differential amplifier 10.

In the degradation detecting apparatus of the described structure, the output signal from the synchronous rectifier circuit 11 is varied by adjusting the phase shift amount in the phase shifter circuit 7 and, since this output signal is proportioned to $\cos \phi$ when the phase difference between the cancelling wave signal Ic and the output signal Ir of the differential amplifier 10 is represented by $\phi$, the output signal becomes zero when $\phi = 90°$. Therefore, in a measurement of the leakage current in the field, the phase shift amount in the phase shifter circuit 7 may be adjusted so that the reading of the meter 12 may become zero, and then, the reading of the meter 13 will give the value of the real resistive-component leakage current Ir.

On the above occasion, the value of the output signal from the synchronous rectifier circuit 11 becomes zero also when $\phi = -90°$. In order not to select this point, it may be checked by increasing the angle $\phi$ in the vicinity of $\phi = 90°$ or $\phi = -90°$ and observing the variation of the output signal, which will vary from positive to negative in one case and from negative to positive in the other case.

The apparatus for detecting degradation of arresters according to the present invention as described in the foregoing includes the arrangement of the prior art degradation detecting apparatus, wherein the signal corresponding to the total leakage current Io flowing through the arrester 2 connected between the power transmission line 1 and ground is subjected to a waveform conversion and, then, passed through the phase shifter circuit 7 and the automatic gain control circuit 9, whereby the signal for the capacitive-component leakage current Ic is derived. As in the prior art, this signal Ic is added as the cancelling wave signal to the signal for the total leakage current Io by means of the differential amplifier 10, whereby the resistive-component leakage current Ir is provided, and thereby, the degradation of the arrester 2 is detected. The apparatus of the invention further includes the synchronous rectifier circuit 11 for performing synchronous rectification of the output signal Ir from the differential amplifier 10 according to the signal for the cancelling wave Ic, the meter 12 for indicating the magnitude of the output signal from the synchronous rectifier circuit 11, and the meter 13 for indicating the magnitude of the output signal Ir from the differential amplifier 10, and is adapted to detect the signal for the real resistive-component leakage current by adjustment of the phase shift amount in the phase shifter circuit 7 so that the phase of the cancelling wave signal may be brought in agreement with the phase of the capacitive-component leakage current signal Ic.

Thus, the apparatus of the invention enables an easy to conduct and precise in-the-field detection of degradation of the arrester 2 in the state as connected to the high tension a.c. power transmission line 1, without the need for taking a voltage signal from a potential transformer or the like as in the case of the prior art. As a result, there is attained an improvement in efficiency and precision of the maintenance work of the arresters, earlier detection of symptoms of malfunction in the power transmission systems, and improvement in reliability of electric power supplies.

Figure 2:
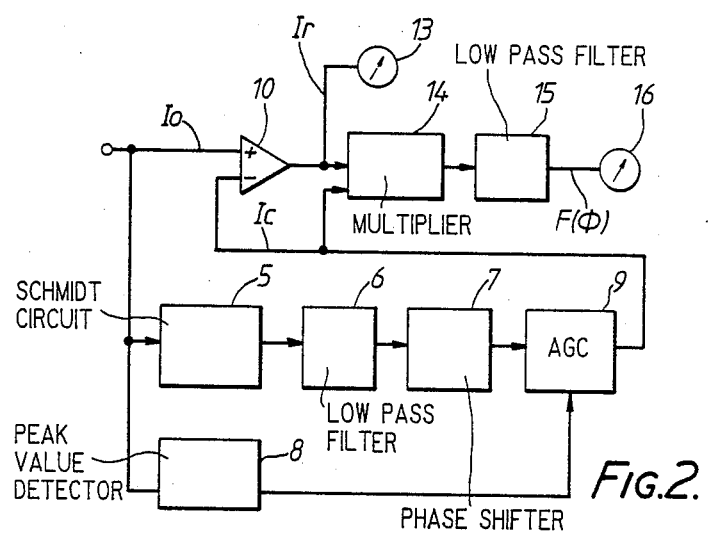
FIG. 2 is a block diagram showing a second embodiment of the invention.

FIG. 2 is a block diagram of a second embodiment of the invention. Referring to FIG. 2, numeral 14 denotes a multiplier for multiplying the output signal Ir from the differential amplifier 10 by the cancelling wave signal Ic as the output signal from the automatic gain control circuit 9, numeral 15 denotes a low-pass filter serving as a time-averaging circuit for averaging the output signal from the multiplier 14 over time, and numeral 16 denotes a meter for indicating the magnitude of the output signal $F(\phi)$ from the low-pass filter 15.

In the degradation detecting apparatus of the described structure, the output signal from the low-pass filter 15 is varied by adjustment of the phase shift amount in the phase shifter circuit 7 and this output signal becomes zero when the phase difference between the cancelling wave signal Ic and the output signal Ir from the differential amplifier 10 is 90°. Therefore, in the measurement of the leakage current in the field, the phase shift amount in the phase shifter circuit 7 may be adjusted so that the reading of the meter 16 may become zero, and then the indication of the meter 13 will give the actual value of the resistive-component leakage current Ir.

In the following, description will be given of the fact that the phase difference between the cancelling wave signal Ic and the output signal Ir from the differential amplifier 10 is 90° when the indicated value by the meter 13 is zero.

First, the total leakage current waveform io(t) and the cancelling waveform ic(t) are given respectively, by $$io(t) = Ic \cos\omega t + [Ir_1 \sin\omega t + Ir_3 \sin3\omega t + Ir_5 \sin5\omega t + \ldots]$$

$$ic(t) = Ic \cos(\omega t - \phi)$$

where $\phi$ is the phase lag of the cancelling wave. Then, the output signal waveform ir(t) from the differential amplifier 10 is expressed by $$\begin{aligned}ir(t) &= Io(t) - ic(t) \\ &= Ic[\cos\omega t - \cos(\omega t - \phi)] + [Ir_1 \sin\omega t + Ir_3 \sin3\omega t + \ldots] \\ &= -2 Ic \sin\frac{\phi}{2} \sin\left(\omega t - \frac{\phi}{2}\right) + \\ &\quad [Ir_1 \sin\omega t + Ir_3 \sin3\omega t \ldots].\end{aligned}$$

Therefore, the reading $F(\phi)$ of the meter 16 is given by $$\begin{aligned}F(\phi) &= \frac{1}{2\pi} \int_0^{2\pi} ic(t) \cdot ir(t) \, dt \\ &= \frac{1}{2\pi} \int_0^{2\pi} \left[ 2 Ic^2 \sin\frac{\phi}{2} \sin\left(\omega t - \frac{\phi}{2}\right) \cos(\omega t - \phi) - Ic\{Ir_1 \sin\omega t + Ir_3 \sin3\omega t + \ldots\} \right. \\ &\quad \left. \cos(\omega t - \phi) \right] dt \\ &= Ic^2 \sin^2\frac{\phi}{2} - \frac{Ic\, Ir_1}{2} \sin\phi \left. \right) \frac{1}{2\pi} \int_0^{2\pi} dt \\ &= Ic^2 \sin\frac{\phi}{2} - \frac{Ic\, Ir_1}{2} \sin\phi \\ &= -\frac{Ic \sqrt{(Ic^2 + Ir_1^2)}}{2} \{\cos(\phi - \beta) - \cos\beta\}.\end{aligned}$$

Figure 3:
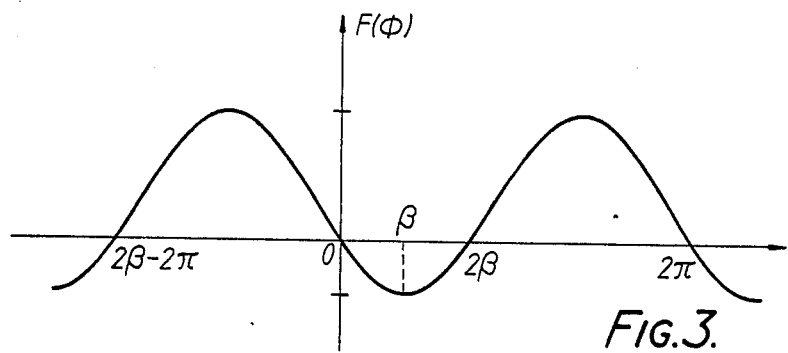
FIG. 3 is a chart showing dependency on the phase difference of the output from the multiplier an the low-pass filter in FIG. 2.

Therefore, $F(\phi)$ takes such a waveform as shown in FIG. 3, and $F(\phi)=0$ holds for $\phi=0\pm2n\pi$ and $\phi=2\beta\pm2n\pi$. When $\phi=0\pm2n\pi$, the signal for the cancelling wave ic(t) and the output signal ir(t) from the differential amplifier 10 are in an orthogonal relationship, and the peak value Ir of the ir(t) at this time becomes the true value of the resistive-component leakage current. However, when $\phi=2\beta\pm2n\pi$, the above orthogonal condition is not satisfied. Therefore, to discriminate between these two $\phi$'s ($\phi_1=0\pm2n\pi$, $\phi_2=2\beta\pm2n\pi$), the difference in the sign of $df/d\phi$ may be utilized, that is, the $\phi$ that causes $F(\phi)$ to decrease (vary from positive value to negative value) when the same is increased can be taken as the right $\phi$.

The first and second embodiments of the invention each are not limited to the detailed descriptions above described, but can also be embodied in the following ways.

Figure 4:
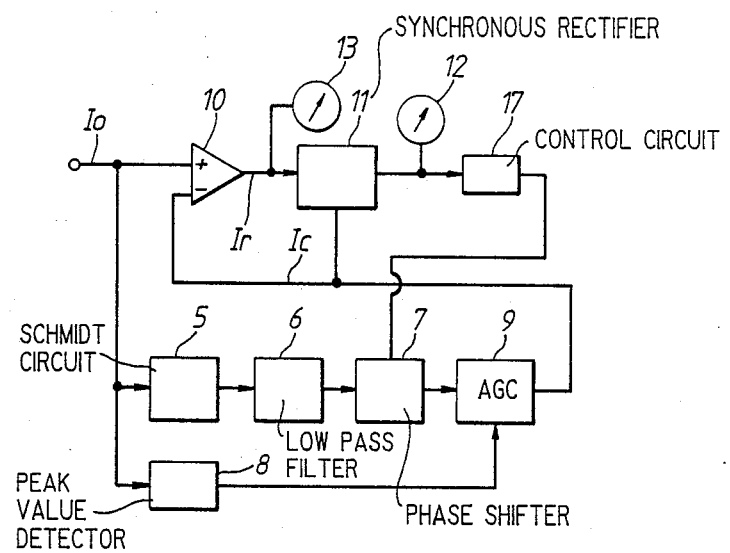
FIG. 4 is a block diagram showing a variation of the first embodiment of the invention.

FIG. 4 is a drawing showing in a block diagram another structural example of the degradation detecting apparatus of arresters according to the first embodiment of the invention, wherein the output signal from the synchronous rectifier circuit 11 is fed back to the phase shifter circuit 7 through a control circuit 17 so that the phase difference $\phi$ between the cancelling wave signal Ic and the output signal Ir from the differential amplifier 10 may be automatically controlled to become 90°. Therefore, in the measurement of the leakage current on the field with this embodiment, it is only needed to read the indication of the meter 13.

Figure 5:
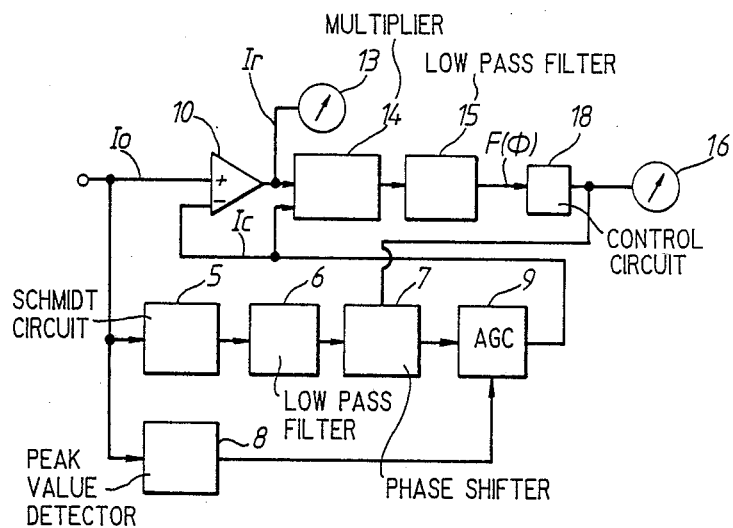
FIG. 5 is a block diagram showing a variation of the second embodiment of the invention.
Figure 6:
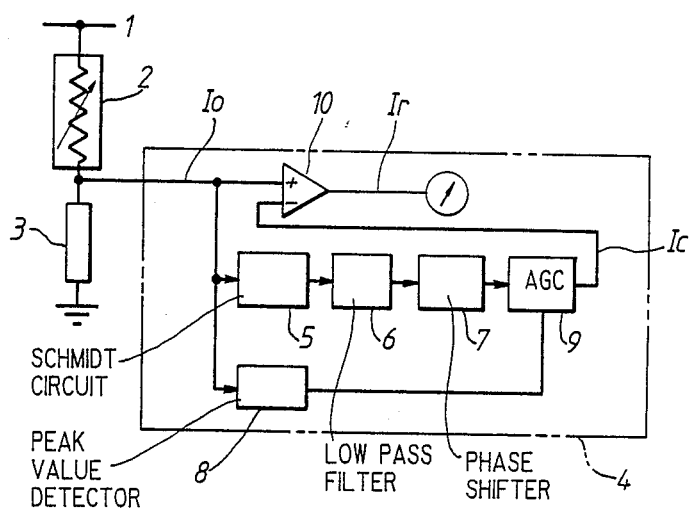
FIG. 6 is a block diagram showing an example of the prior art degradation detecting apparatus.
Figure 7:
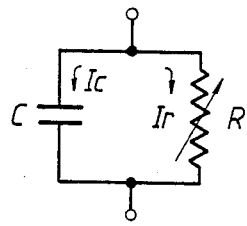
FIG. 7 is a drawing showing an equivalent circuit to a zinc oxide element.
Figure 8:
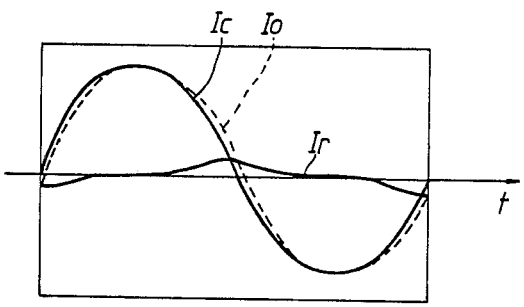
FIG. 8 is a waveform chart showing the leakage current in an arrester.

FIG. 5 is a drawing showing in a block diagram another structural example of the degradation detecting apparatus of arresters according to the second embodiment of the invention, wherein the output signal $F(\phi)$ from the low-pass filter 15 is fed back to the phase shifter circuit 7 through a control circuit 18 so that the output signal $F(\phi)$ averaged for time may be automatically controlled to become zero. In the present case, the control circuit 18 is adapted, as described previously, to function in the direction to increase $\phi$ when $F(\phi)>0$ and in the direction to decrease $\phi$ when $f(\phi)<0$.

According to the present invention as described so far, an extremely reliable arrester degradation detecting apparatus capable of a simple and precise on-the-field detection of degradation of the arrester in the state as connected to a high tension power transmission line, without the need for taking a voltage signal from a potential transformer or the like, can be provided.

Obviously, numerous modifications and variations of the present invention are possible in light of the above teachings. It is therefore to be understood that within the scope of the appended claims, the invention may be practiced otherwise than as specifically described herein.

What is claimed as new and desried to be secured by Letters Patent of the United States is:

1. An apparatus for detecting degradation of an arrester grounded by a grounding conductor, comprising:
   a wave conversion circuit for producing a total leakage current signal corresponding to the total leakage current flowing through the aresster, said total leakage current signal including a resistive component superimposed on a capacitive component;
   means coupled to said wave conversion circuit for generating a cancelling wave signal Ic based on the total leakage current signal, including a phase shifter circuit for shifting the phase of the cancelling wave signal Ic;
   a differential amplifier for adding said cancelling wave signal Ic to the total leakage current signal and thereby extract a resistive-component leakage current signal Ir at an output thereof;
   a synchronous rectifier circuit for synchronous rectification of the signal Ir from said differential amplifier according to said cancelling wave signal Ic; and
   means for adjusting the phase shift amount in said phase shifter circuit to produce a 90° phase difference between the signals Ir and Ic so that the output signal from said synchronous rectifier circuit may become zero, thereby bringing the phase of the cancelling wave signal Ic in agreement with the phase of the capacitive component of the total leakage current signal to detect at the output of said differential amplifier the resistive component of the total leakage current signal indicative of degradation of said arrester.

2. An apparatus for detecting degradation of an arrester according to claim 1, further comprising:
   a control circuit interposed between said synchronous rectifier circuit and said phase shifter circuit with the output signal from said synchronous rectifier circuit fed back to said phase shifter circuit through said control circuit so that the output signal from said synchronous rectifier circuit may automatically become zero.

3. An apparatus for detecting degradation of an arrester grounded by a grounding conductor, comprising:
a wave conversion circuit for producing a total leakage current signal corresponding to the total leakage current flowing through the arrester, said total leakage current signal including a resistive component superimposed on a capacitive component;
means coupled to said wave conversion circuit for generating a cacelling wave signal Ic based on the total leakage current signal, including a phase shifter circuit for shifting the phase of the cancelling wave signal Ic;
a differential amplifier for adding said cancelling wave signal Ic to the total leakage current signal and thereby extract a resistive-component leakage current signal Ir at an output thereof;
a multiplier for multiplying the output signal Ir from said differential amplifier by said cancelling wave signal Ic;
a time-averaging circuit for averaging an output signal from said multiplier over time; and
means for adjusting the phase shift amount in said phase shifter circuit to produce a 90° phase difference between the signals Ir and Ic so that the output signal from said time-averaging circuit may become zero, thereby bringing the phase of the cancelling wave signal Ic in agreement with the phase of the capacitive component of the total leakage current signal to detect at the output of said differential amplifier the resistive component of the total leakage current signal indicative of degradation of said arrester.

4. An apparatus for detecting degradation of an arrester according to claim 3, comprising:
a control circuit interposed between said time averaging circuit and said phase shifter with the output signal from said time averaging circuit fed back to said phase shifter circuit through said control circuit so that the output signal from said time-averaging circuit may automatically become zero.

* * * * *